(12) United States Patent
Gropper et al.

(10) Patent No.: US 7,345,513 B2
(45) Date of Patent: Mar. 18, 2008

(54) DRIVER CIRCUIT WITH AUTOMATIC OFFSET COMPENSATION OF AN AMPLIFIER AND METHOD FOR OFFSET COMPENSATION OF AN AMPLIFIER OF A DRIVER CIRCUIT

(75) Inventors: Karl-Josef Gropper, Senden (DE); Herbert Knotz, Erbach (DE); Michael Offenwanger, Burgau (DE); Armin Prohaska, Ulm-Ermingen (DE)

(73) Assignee: Atmel Germany GmbH, Heilbronn (DE)

( * ) Notice: Subject to any disclaimer, the term of this patent is extended or adjusted under 35 U.S.C. 154(b) by 75 days.

(21) Appl. No.: 11/285,106

(22) Filed: Nov. 23, 2005

(65) Prior Publication Data

US 2006/0114036 A1    Jun. 1, 2006

(30) Foreign Application Priority Data

Nov. 26, 2004    (DE)    ...................... 10 2004 058 595

(51) Int. Cl.
 *H03B 1/00* (2006.01)
 *H01S 3/13* (2006.01)
 *G01J 1/32* (2006.01)

(52) U.S. Cl. ............ 327/108; 372/29.014; 372/29.015; 372/38.07; 250/205

(58) Field of Classification Search ...................... None
See application file for complete search history.

(56) References Cited

U.S. PATENT DOCUMENTS

| | | | |
|---|---|---|---|
| 4,813,048 A * | 3/1989 | Yamane et al. | .......... 372/38.07 |
| 4,856,011 A * | 8/1989 | Shimada et al. | ......... 372/29.01 |
| 5,015,836 A | 5/1991 | Van Antwerp | |
| 5,661,739 A * | 8/1997 | Ohashi | ................... 372/29.011 |
| 5,966,395 A * | 10/1999 | Ikeda | ...................... 372/38.01 |
| 6,392,215 B1 | 5/2002 | Baumgartner et al. | |
| 6,549,265 B1 | 4/2003 | Sakakibara et al. | |
| 6,778,784 B1 | 8/2004 | Schrodinger | |
| 2003/0201950 A1 | 10/2003 | Sakamoto et al. | |
| 2005/0135440 A1* | 6/2005 | Ikeda et al. | ............. 372/29.011 |
| 2005/0141576 A1* | 6/2005 | Ikeda et al. | ............... 372/38.02 |

FOREIGN PATENT DOCUMENTS

| | | |
|---|---|---|
| DE | 40 24 002 A1 | 1/1992 |
| WO | WO 2004/040721 A1 | 5/2004 |

* cited by examiner

*Primary Examiner*—Tuan T Lam
(74) *Attorney, Agent, or Firm*—Geissler, Olds & Lowe, PLLC

(57) ABSTRACT

A driver circuit is provided, which includes a differential amplifier whose output signal controls the driving input signal, a reference signal generator that supplies a reference input of the differential amplifier, an external feedback that applies a signal, which is dependent on the output signal, to a feedback input of the differential amplifier, an adapter circuit, and an internal feedback activated in a compensation mode as an alternative to the external feedback, which internal feedback provides a signal to both the feedback input and the adapter circuit even for input signals that do not exceed the first threshold. The adaptor circuit generates and stores a compensation signal that compensates an offset signal acting alone at the reference input when the reference signal generator is switched off, and feeds the stored compensation signal, together with a reference signal, to the reference input or feedback input when the external feedback is activated.

12 Claims, 3 Drawing Sheets

DRIVER CIRCUIT WITH AUTOMATIC OFFSET COMPENSATION OF AN AMPLIFIER AND METHOD FOR OFFSET COMPENSATION OF AN AMPLIFIER OF A DRIVER CIRCUIT

This nonprovisional application claims priority under 35 U.S.C. § 119(a) on Patent Application No. 10 2004 058 595.4 filed in Germany on Nov. 26, 2004, which is herein incorporated by reference.

BACKGROUND OF THE INVENTION

1. Field of the Invention

The present invention relates to a driver circuit, which in an operating mode drives a component that supplies output power when a driving input signal exceeds a first threshold value, having a differential amplifier whose output signal controls the driving input signal, having a reference signal generator that supplies a reference input of the differential amplifier, and having an external feedback that applies a signal, which is dependent on the output signal, to a feedback input of the differential amplifier.

The invention further relates to a method for compensation of offset currents in such a driver circuit.

2. Description of the Background Art

A typical example of such a component is a laser diode in which a laser effect occurs only above a laser threshold. For a laser diode, the external feedback takes place by the radiated optical power of the laser diode and a photodiode that is connected to the feedback input and receives a portion of the radiated optical power. When the laser diode radiates a comparatively high optical power, the photodiode supplies a high photocurrent to the feedback input of the differential amplifier. This reduces the difference at the input of the differential amplifier, which reduces the output signal of the differential amplifier, and thereby reduces the optical power of the laser diode. Similarly, a relatively low radiated optical power leads to an increase in the difference and thereby to an increase in the optical power. The feedback thus closes a control loop, by which a stable optical power is established at a stable input signal difference in the steady state.

In this context, a signal difference corresponding to the quotient of the output signal and the gain of the differential amplifier is established between the reference input and the feedback input.

Ideal differential amplifiers deliver reproducibly identical output signals for specific reference signal values and thus possess a reproducibly stable characteristic curve. In real differential amplifiers, however, shifts in the characteristic curves arise through offset currents of the differential amplifiers. The offset currents can be represented in an equivalent schematic as an additive offset of the reference signal.

In the case of a driver circuit with a differential amplifier that has such an offset, therefore, signal distortion occurs at the reference input. In the absence of countermeasures, such a signal distortion is stabilized by the external feedback. When the reference signal is switched off, the offset current alone acts as a reference signal in the equivalent schematic. Under certain circumstances, namely when the laser threshold is exceeded, the external feedback then establishes a final output power even though the switched off reference signal generator should likewise reduce the output power to zero.

For this reason, such behavior is always problematic when small output power levels are to be established, as is the case for a laser diode in a CD or DVD unit in read operation, for example.

SUMMARY OF THE INVENTION

It is therefore an object of the invention to provide an improved driver circuit in which offset currents of a differential amplifier are compensated.

This object is attained in a method of the aforementioned type in that the driver circuit has an adapter circuit and an internal feedback that can be activated in a compensation mode as an alternative to the external feedback, the internal feedback providing a signal to both the feedback input and an adapter circuit even for input signals that do not exceed the first threshold, in that the adaptor circuit generates from the signal, and stores, a compensation signal that compensates an offset signal acting alone at the reference input when the reference signal generator is switched off, and in that the adaptor circuit feeds the stored compensation signal, together with a reference signal provided by the reference signal generator, to the reference input or the feedback input when the external feedback is activated.

This object is further attained in a method of the aforementioned type by the following steps: activation of an internal feedback that can be activated in a compensation mode as an alternative to the external feedback and that provides a signal to both the feedback input and the adapter circuit even for input signals which do not exceed the first threshold, storage of a compensation signal that is generated from the signal and that compensates an offset signal acting alone at the reference input when the reference signal generator is switched off, and, when the external feedback is activated, feeding of the stored compensation signal to the reference input or the feedback input, in addition to the feeding of a reference signal provided by the reference signal generator.

In compensation mode with the reference signal generator switched off and the external feedback deactivated, a detected feedback signal can be unambiguously associated with an undesired offset current of the differential amplifier. The generation and storage of a compensation signal in the compensation mode, together with the additional feeding of the compensation signal in the operating mode, leads to the desired compensation of problematic offset currents.

With regard to embodiments of the driver circuit, it is preferred for the internal feedback to have a threshold filter that only allows feedback signals to pass which exceed a second threshold.

Due to this embodiment, the adaptation process takes place for output signals of the differential amplifier, which result in feedback signals of a minimum amplitude determined by the second threshold. As a result, the compensation values determined in the compensation mode that are above the second threshold value but below the first threshold value can be transmitted to the later operating mode better than would be the case in adaptation with arbitrarily small output signals of the differential amplifier.

Another embodiment includes a threshold filter as a current source that is connected to the internal feedback and that receives or emits a current up to a predetermined maximum current amplitude corresponding to the second threshold.

This embodiment represents a particularly simple and continuous form of threshold filtering. The current source can be implemented, for example, as a source of negative currents, hence as a current sink, that is connected to the internal feedback and receives small currents, and only allows currents in excess of its maximum current to pass by into the feedback.

It is also preferred for the internal feedback to have an output coupling circuit that couples a feedback signal out of the internal feedback and supplies it to the adapter circuit.

As a result of such a coupling taking place in the internal feedback in parallel with the continuation of the feedback signal, the adaptation can take place continuously in the compensation mode and with no disturbing influence on the loop including the differential amplifier and inner feedback, in contrast to a switchover that supplies the feedback signal to the adapter circuit at certain times and to the feedback input of the differential amplifier at certain times.

Moreover, the output coupling circuit can have a current mirror that reflects a current fed out of the differential amplifier into the internal feedback, reflecting the current into a current branch leading to the feedback input as well as into a measuring branch of the adapter circuit.

The coupling with the current mirror has the advantage that any desired transmission ratios between the currents in different branches of the current mirror can be established by the number and dimensioning of the elements used. It is thus possible to set the attenuation of the signal feedback, for example.

The adapter circuit can have a detector that detects a signal amplitude of the coupled-out feedback signal and transmits it to a control unit.

The signal amplitude of the feedback signal is a measure of the amplitude of the offset current. This embodiment thus permits indirect measurement of the offset current.

Moreover, the detector can periodically sample the signal amplitude.

By means of the periodic sampling, a sequence of discrete measurements is produced, which can easily be processed by the subsequent control unit into stepwise changes in a compensation signal.

The detector can also be embodied as a clocked comparator, as this has a very high sensitivity. This measure permits a minimization of the interaction between the measurement intervention and the internal feedback.

Another embodiment provides that the control unit can store the signal amplitude and, by controlling a compensating current source, creates a compensating current at the reference input which at least partially compensates the offset current.

By this embodiment, the appropriate value of the compensating current is determined successively, because an initial partially completed compensation, which still does not lead to a change in feedback signal in the compensation mode, is stored and can thus serve as a basis for further change in the compensating current.

With regard to embodiments of the method, it is thus preferred for generation of the compensation signal to be performed in a stepwise manner, wherein the signal supplied to the adapter circuit is compared to a third threshold and wherein the compensation signal is changed in a stepwise fashion from a starting value until the signal supplied to the adapter circuit crosses the third threshold.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
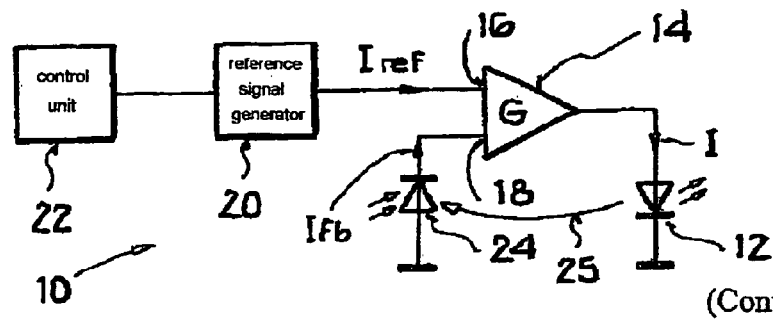
FIG. 1 illustrates a conventional arrangement of a driver circuit with external feedback.

FIG. 1 shows a conventional driver circuit 10, which drives a laser diode 12. The driver circuit 10 has a differential amplifier 14 that has a reference input 16 and a feedback input 18, as well as a reference signal generator 20, a control unit 22, and a photodiode 24. The reference input 16 is fed by the reference signal generator 20, which is controlled by the control unit 22. Connected to the feedback input 18 is the photodiode 24, which, during operation of the driver circuit 10 and the laser diode 12, receives a portion of the optical power radiated by the laser diode 12 through an optical coupling 25 and converts it into a photocurrent. The photocurrent serves as the feedback signal Ifb. The differential amplifier 14 provides a current I as a control signal for the laser diode 12, whereby the current depends on the gain G and the difference between the signals at the reference input 16 and the feedback input 18. In this way, the power radiated by the laser diode 12 and the signal shape of the optical output signal are determined by the reference signal generator 20 and the control unit 22, and are regulated in an external feedback that is connected by the optical coupling 25 between the laser diode 12 and the photodiode 24.

Figure 2:
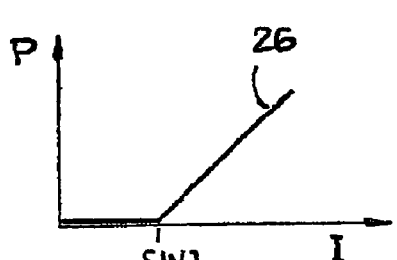
FIG. 2 is a characteristic curve of a laser diode.

FIG. 2 shows a characteristic curve 26 of the laser diode 12. In this context, the optical power P of the laser diode is plotted as a function of the driving input signal I. As is evident from the course of the characteristic curve 26, an optical power P does not appear until the driving input signal I exceeds a threshold SW1. This threshold SW1 corresponds in the case of the laser diode 12 to the laser threshold, which must be exceeded for the laser effect to occur. The laser diode 12 thus represents an example of a component that only provides an output power P when a driving input signal I exceeds a first threshold SW1.

Figure 3:
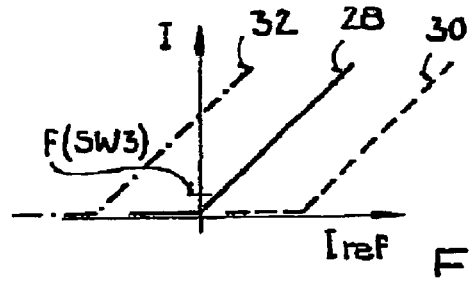
FIG. 3 illustrates characteristic curves of a differential amplifier with and without offset currents of different polarities.

FIG. 3 shows typical characteristic curves of a differential amplifier, for example the differential amplifier 14 from FIG. 1. In this context, the output signal I of the differential amplifier 14 is plotted as a function of the reference signal Iref, wherein the characteristic curves have been recorded in an open loop condition, which is to say with a constant signal at the feedback input 18. The output signal I of the differential amplifier 14, which in FIG. 3 is plotted at the ordinate, represents for example the driving input signal I for the laser diode 12, which in FIG. 2 is plotted along the abscissa. FIG. 3 shows a total of three characteristic curves 28, 30 and 32, wherein the number 28 designates an ideal characteristic curve. The ideal characteristic curve 28 is characterized in that it passes through the coordinate origin with no offset current, so that even a small change in the reference signal Iref from zero results in a finite change in the output signal I.

As already mentioned above, however, real differential amplifiers have offset currents which can be represented in an equivalent schematic as additive effects on the signal at the reference input, where the additive effects can be positive as well as negative. The characteristic curve 30 shown in dashed lines results from shifting the ideal characteristic curve 28 to the right, which corresponds to a negative offset current: If the ideal characteristic curve 28 is considered as a function of Iref, then the characteristic curve 30 can be generated as the identical function with the argument (Iref−Ioff), where Ioff represents the offset current. Analogously, the characteristic curve 32, produced by shifting the ideal characteristic curve 28 to the left, represents a positive offset current that could be represented in a functional representation as a positive offset in an argument Iref+Ioff.

Figure 4:
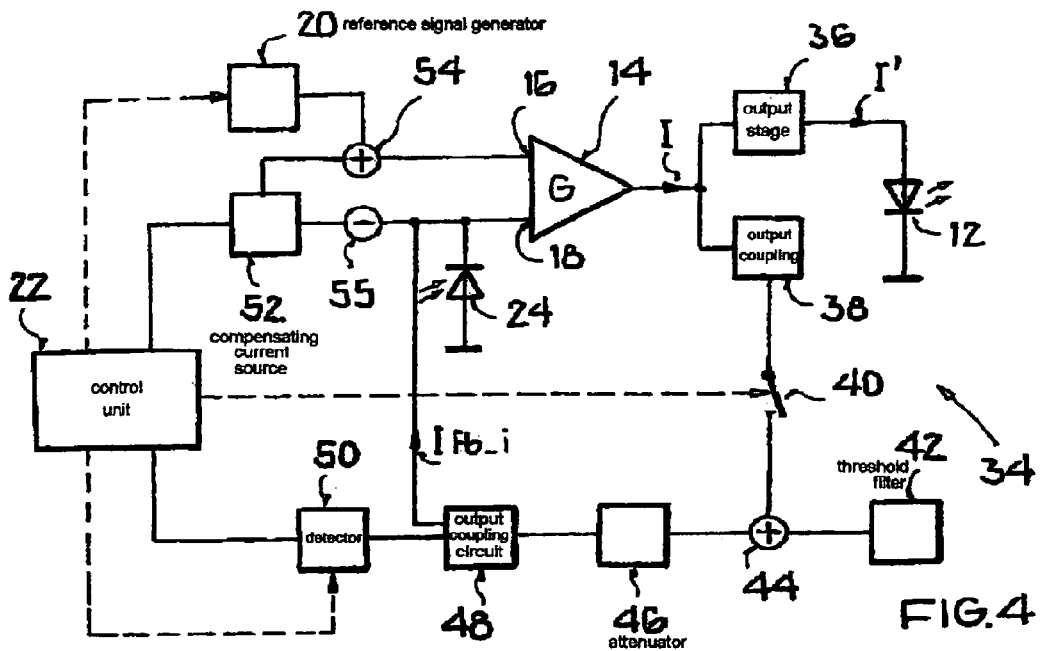
FIG. 4 is a block diagram of an example embodiment of a driver circuit according to the present invention.

FIG. 4 shows a block diagram of an example embodiment of a driver circuit 34, with which both the positive and negative offsets of the characteristic curves 32 and 30 relative to the ideal characteristic curve 28 can be adapted in a special compensation mode, by which a compensation of the shifts can occur even in a normal operating mode. The driver circuit 34 includes, among other items, a laser diode 12, a differential amplifier 14 with reference input 16 and feedback input 18, a reference signal generator 20, a control unit 22, and a photodiode 24 that is connected to the feedback input 18 of the differential amplifier 14.

In addition to these elements, the driver circuit 34 also has an output stage 36, a switch 40, a threshold filter 42, a threshold combining element 44, an attenuator 46, an output coupling circuit 48, a detector 50, a compensating current source 52, and a combining element 54 and/or a combining element 55. In this regard, the output stage 36 serves only to further amplify the output signal I of the differential amplifier 14 into an input signal I' of the laser diode 12. The output coupling 38 serves to couple out a feedback signal that is fed to the feedback input 18 of the differential amplifier 14 through an internal feedback in a compensation mode. The internal feedback is activated by closing the switch 40 and includes the threshold filter 42, the threshold combining element 44, the attenuator 46, and the output coupling circuit 48.

In this context, the threshold filter 42 defines a second threshold value SW2 for regulation by the internal feedback; said second threshold value is smaller than the first threshold value SW1 acting in the external feedback, corresponding, for example, to the laser threshold of the laser diode 12. The control unit 22 switches the driver circuit 34 into a compensation mode by closing the switch 40. The output signal I of the differential amplifier 14 that is coupled into the internal feedback through the output coupling 38 is combined in the combining element 44 with the comparatively low second threshold value SW2 of the threshold filter 42. In this regard, this combination can take place, for example, in such a manner that the threshold filter 42 can draw a current from the combining element 44 up to a predefined maximum value, so that the combining element 44 only transmits a signal to the attenuator 46 when the maximum value defined by the threshold filter 42 is exceeded by the output signal I coupled out of the differential amplifier 14. The portion of the output signal I of the differential amplifier 14 that exceeds the second threshold value SW2 is attenuated by the attenuator 46 to such a degree that a stable internal feedback is ensured. The attenuated signal is applied to the feedback input 18 of the differential amplifier 14 through the output coupling circuit 48 as feedback signal Ifb_i of the internal feedback.

Since the second threshold value SW2 which acts in the internal feedback is lower than the first threshold value SW1 which acts in the external feedback, a relatively large feedback signal Ifb_i initially appears at the feedback input 18 of the differential amplifier 14 when switch 40 is closed, which is to say in compensation mode. As a result, the input signal difference at the differential amplifier 14 drops, and consequently so does the amplitude of the output signal I that is combined with the input signal difference by the gain G. With appropriate dimensioning of the second threshold value SW2, in comparison to the first threshold value SW1, the input signal I' of the laser diode 12 then drops below the laser threshold so that the optical power radiated by the laser diode 12 ceases. As a result, the optical coupling between the laser diode 12 and the photodiode 24 also ceases so that the external feedback, which is closed through this optical coupling in the operating mode, is deactivated.

In addition to the deactivation of the external feedback through the closing of the switch 40, the reference signal generator 20 is also switched off in the compensation mode so that it no longer provides a signal to the reference input 16 of the differential amplifier 14. If the characteristic curve of the differential amplifier 14 corresponds to the ideal characteristic curve 28 from FIG. 3, the output signal I of the differential amplifier 14 will then also drop to zero and the input signal difference between the inputs 16 and 18 of the differential amplifier 14 will vanish.

In contrast, if the differential amplifier 14 has a characteristic curve 32 from FIG. 3 that is shifted to the left by a positive offset, then even when the reference signal is switched off an output signal I will appear, which is fed back to the feedback input 18 of the differential amplifier 14 through the internal feedback as an attenuated signal Ifb_i. By an adapter circuit formed of the detector 50, the control unit 22, the compensating current source 52, and the combining element 54 and/or the combining element 55, this undesirable offset can be learned in the compensation mode and can be compensated in the subsequent operating mode. The output coupling circuit 48 couples a signal out of the internal feedback in which the feedback signal Ifb_i is reflected. The reflection can be identical, for example, so that a signal Ifb_i is fed into the detector 50 of the adapter circuit.

The detector 50 compares the fed-in feedback signal Ifb_i to a predefined third threshold value SW3, and if the signal exceeds or drops below the third threshold value SW3, the detector supplies an appropriate signal to the control unit 22. The control unit 22 controls the detector 50 by means of the dashed connection between the blocks 22 and 50 in such a manner that, for example, the detector 50 samples its input signal at predetermined time intervals specified by the control unit 22 and compares it to the third threshold value SW3. The third threshold value SW3 can, e.g., be dimensioned such that it corresponds to the value f(SW3) in the graph in FIG. 3. In this regard, the value f(SW3) in FIG. 3 is drawn relatively high on the I-axis for reasons of clarity, and is brought still closer to the coordinate origin in implementations of the invention.

If the third threshold value SW3 is immediately exceeded at the beginning, as is the case in the characteristic curve 32 from FIG. 3, the control unit 22 triggers a stepwise change in a compensating current by the compensating current source 52, which is applied through the combining element 54 to the reference input 16 and/or through the combining element 55 to the feedback input 18 of the differential amplifier 14, and is intended to compensate the offset current acting there. In order to achieve the effect of a positive (negative) compensating current at the reference input 16, feed-in to the feedback input 18 must take place with a negative (positive) polarity. As has already been mentioned, the characteristic curve 32 corresponds to a positive offset current so that in this case the control unit 22 establishes a negative compensating current of the compensating current source 52 if the compensating current is fed in through the reference input. This is reflected in a change in the feedback signal Ifb_i by means of the internal feedback.

In the case of the characteristic curve 32 from FIG. 3, the application of a negative compensating current into the combining element 54 results in a shift to the right of the characteristic curve 32. As a result, the point of intersection of the characteristic curve 32 with the I-axis drops. With successive increases in the negative compensating current by the adapter circuit, the characteristic curve 32 shifts successively further downward until the value crosses below f(SW3). This downward crossing is detected by the detector 50 and is registered by the control unit 22. The control unit 22 then commands the compensating current source 52 to maintain the last compensating current value used, and to use it with activated external feedback in the subsequent operating mode.

In similar fashion, a characteristic curve 30 in FIG. 3 that is initially shifted to the right by a negative offset current, is shifted to the coordinate origin by successive determination of a compensating positive compensation current.

Figure 5:
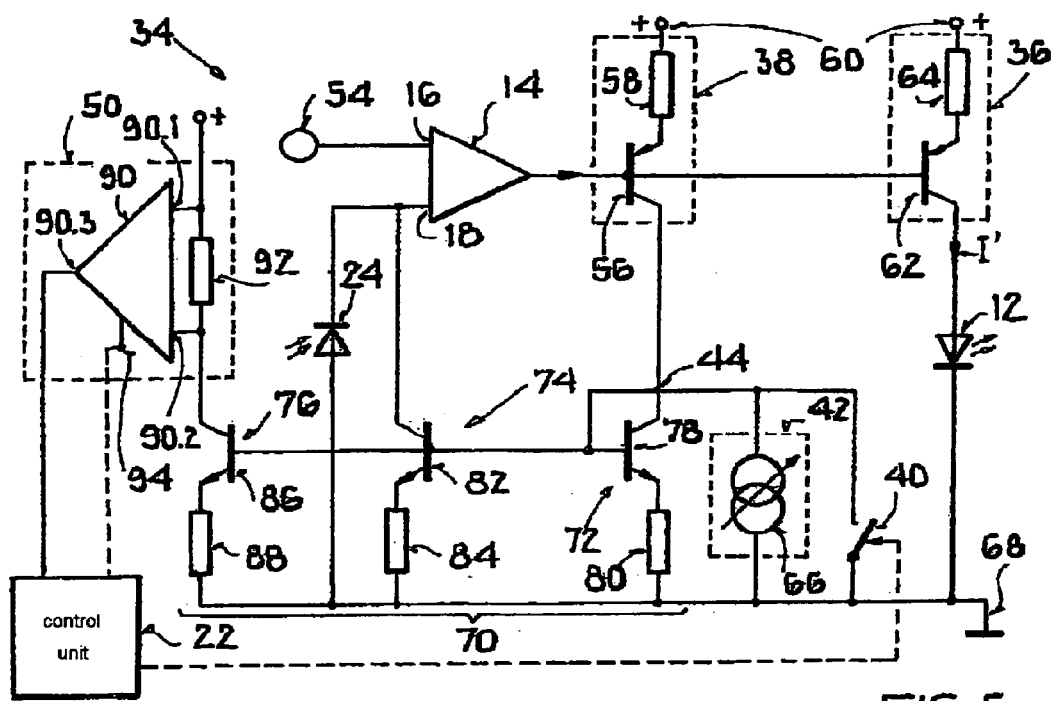
FIG. 5 is a circuit diagram illustrating an example of possible circuit implementations of various blocks from FIG. 4.

FIG. 5 shows a circuit diagram as an example of possible circuit implementations of various blocks from FIG. 4. Thus, the coupling 38 can be accomplished by a transistor 56, which is connected through an emitter resistor 58 to a supply voltage 60, which is controlled by the output signal of the differential amplifier 14, and whose collector is connected to the threshold combining element 44. In the circuit 34 shown in FIG. 5, the output signal of the differential amplifier can be a voltage or a current. The output stage 36 can likewise be implemented through a transistor 62 which is connected through an emitter resistor 64 to a supply voltage 60, which likewise is controlled by the output signal I of the differential amplifier 14, and whose collector current serves as the input signal I' of the laser diode 12. The threshold filter 42 can include, for example, a variable current source 66 that draws from the threshold combining element 44 a current of variable amplitude, but predefined maximum amplitude, and which is connected between the threshold combining element 44 and a ground connection 68.

A current mirror 70, which has three branches 72, 74 and 76, mirrors a current flowing in the first branch 72 as feedback current Ifb_i from the threshold combining element 44 through a transistor 78 and a resistor 80 to the ground potential 68, to the other two branches 74 and 76, each of which likewise has its own transistor 82, 86 and emitter resistor 84, 88. The collector of the transistor 82 of the second branch 74 is connected to the feedback input 18 of the differential amplifier 14, thus closing the internal feedback. As in the case in FIG. 4, the switch 40 serves to deactivate the external feedback. But unlike FIG. 4, it is arranged in FIG. 5 such that it deactivates the external feedback in the closed state.

In the implementation in FIG. 5, the attenuator shown as block 46 in FIG. 4 results from the transmission ratio of the currents in the branches 72 and 74. The current mirrored in the third branch 76 constitutes a current coupled out of the internal feedback, so the third branch 76 in combination with the other two branches 72, 74 of the current mirror 70 represents the function of the output coupling circuit 48 from FIG. 4. In this context, the transistors and resistors can be dimensioned such that a different current is fed into the measuring branch 76 than into the feedback branch 74. For example, by means of a higher current in the measuring branch 76, the voltage drop can be increased through a measurement resistor 92, which increases the sensitivity of the measurement. The detector 50 from FIG. 4 is implemented, for example, by a comparator 90 in conjunction with the measurement resistor 92. The comparator 90 can take the form of a "latched comparator" or a "clocked comparator." A clocked comparator of this nature has, in addition to differential inputs 90.1 and 90.2, a clock input 94. When the clock signal is switched on, a positive feedback is activated within the comparator 90, which latches the state at the output 90.3 of the comparator 90. This state is then, which is to say until the next pulse of the clock signal, independent of the input signal. As a result of the positive feedback, the gain of the comparator 90 is very large at the time of switchover, so even the smallest changes between the differential inputs 90.1 and 90.2 result in unambiguous signals at the output 90.3.

Figure 6:
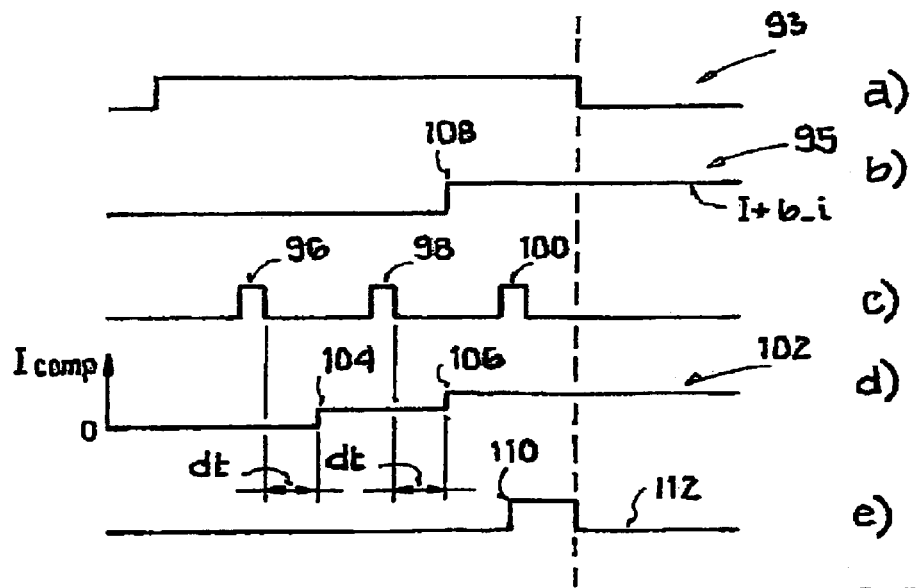
FIG. 6 shows timing diagrams of signals such as those arising during the course of an example embodiment of the inventive method in the block diagram in FIG. 4.

FIG. 6 shows time behaviors of signals such as those that can be obtained at various points in the circuits in FIGS. 4 and 5 when the differential amplifier 14 has the characteristic curve 30 shifted to the right by a negative offset current as shown in FIG. 3. The high level of the signal 93 in FIG. 6*a* represents an active compensation mode, while the low signal level there represents an active operating mode. As is evident from FIG. 3, in the case of the characteristic curve 30 as output signal I of the differential amplifier 14, a zero signal, or a signal that is smaller than the value f(SW3) in FIG. 3, is established. Consequently, no current flows initially in the internal feedback, so that the feedback signal Ifb_i is also zero at first. This is represented by the initially low signal level in FIG. 6*b*, which represents the time behavior 95 of the signal Ifb_i.

FIG. 6*c* illustrates sampling of the feedback signal Ifb_i by the detector 50. In this context, the pulses 96, 98 and 100 each correspond to periods of time in which the control unit 22 applies a clock signal to the clock input 94 of the comparator 90 in FIG. 5, thus recording a measurement. FIG. 6*d* illustrates a possible curve 102 of a compensating current Icomp. Initially, i.e. at the first measurement by the pulse 96, the compensation value is still zero. Since the detector 50 determines at the first measurement that the feedback signal Ifb_i is below the third threshold value SW3, the control unit 22 sets a first base value of a positive compensating current by means of the compensating current source 52, wherein the setting in FIG. 6 takes place in each case with a delay dt. This base value corresponds to the first stage 104 in the signal 102. As a result, the characteristic curve 30 from FIG. 3 is shifted somewhat to the right toward the coordinate origin.

If the shift is not yet enough to place the characteristic curve 30 above the threshold value f(SW3), the base value of the set compensating current was apparently too small, and at the next measurement pulse 98 the detector 50 again determines that the feedback signal Ifb_i lies below the third threshold value SW3. In consequence, the control unit 22, with the aid of the compensating current source 52, increases the compensating current by a predetermined step size corresponding to the level height in FIG. 6d at the transition from the level 104 to the level 106. For the following discussion, it is assumed that the compensating current is now so large that it overcompensates the negative offset current. In the illustration in FIG. 3, this means that the characteristic curve 30 has been shifted far enough to the left that the threshold value f(SW3) now lies below the shifted characteristic curve 30.

Then, with the reference signal generator 20 still switched off, an output signal I appears at the output of the differential amplifier 14, and this signal is reflected by an increase in the feedback signal Ifb_i. In FIG. 6b, this is represented by the level 108 in the signal curve 95. In keeping with the aforementioned assumption, Ifb_i will be so large that the detector 50 will determine at its next sampling pulse 100 that the third threshold SW3 has been exceeded. The detector signals this by a switchover to a high signal level 110 in the signal 112 that is fed into the control unit 22 through the closed switch 94. The control unit 22 thus registers the crossing above the third threshold SW3 and terminates the compensation mode, which is represented in FIG. 6a by the falling edge in the signal 93. At the same time, the compensating current source 52 latches the compensating current value that was determined. Consequently, in a subsequent operating mode, operation always approaches the ideal characteristic curve 28 from FIG. 3.

Figure 7:
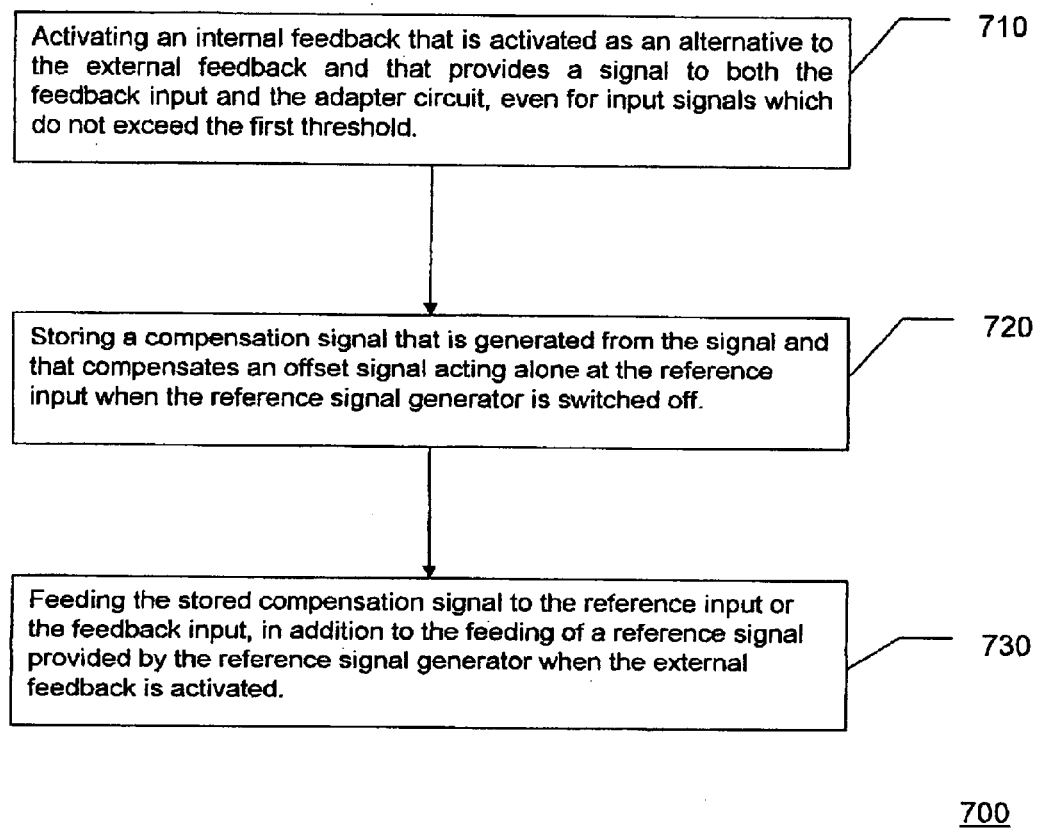
FIG. 7 shows a flow chart of an exemplary embodiment of a method for compensating offset currents in a driver circuit.

FIG. 7 shows an exemplary method for compensating offset currents in a driver circuit, which in an operating mode drives a component that only supplies output power when a driving input signal exceeds a first threshold value, and which includes a differential amplifier 14 whose output signal controls the driving input signal, a reference signal generator 20 that supplies a reference signal to a reference input 16 of the differential amplifier 14, and an external feedback (e.g., via optical coupling 25 in FIG. 1) that applies a signal, which is dependent on the output signal, to a feedback input 18 of the differential amplifier 14. The method 700 includes activating (e.g., step 710) an internal feedback that is activated as an alternative to the external feedback and that provides a signal to both the feedback input 18 and an adapter circuit, even when the driving input signal does not exceed the first threshold. The method 700 further includes storing (e.g., 720) a compensation signal that is generated from the signal and that compensates an offset signal acting alone at the reference input 16 when the reference signal generator 20 is switched off. The method 700 also includes feeding (e.g., 730) the stored compensation signal to the reference input 16 or the feedback input 18, in addition to the feeding of the reference signal provided by the reference signal generator 20 when the external feedback is activated.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A driver circuit, which in an operating mode drives a component that only supplies output power when a driving input signal exceeds a first threshold value, the driver circuit comprising:

a differential amplifier whose output signal controls the driving input signal;

a reference signal generator that supplies a reference signal to a reference input of the differential amplifier;

an external feedback that applies a signal, which is dependent on the output signal, to a feedback input of the differential amplifier;

an adapter circuit; and an internal feedback that is activated in a compensation mode as an alternative to the external feedback, which internal feedback provides a signal to both the feedback input and the adapter circuit even when the driving input signal does not exceed the first threshold, value wherein the adaptor circuit generates from the signal, and stores, a compensation signal that compensates an offset signal acting alone at the reference input when the reference signal generator is switched off, and wherein the adaptor circuit feeds the stored compensation signal, together with the reference signal provided by the reference signal generator, to the reference input or the feedback input when the external feedback is activated.

2. The driver circuit according to claim 1, wherein the internal feedback has a threshold filter that only allows feedback signals to pass which exceed a second threshold.

3. The driver circuit according to claim 2, wherein the threshold filter is a current source that is connected to the internal feedback and receives or emits a current up to a predetermined maximum current amplitude corresponding to the second threshold.

4. The driver circuit according to claim 1, wherein the internal feedback has an output coupling circuit that couples a feedback signal out of the internal feedback and supplies it to the adapter circuit.

5. The driver circuit according to claim 4, wherein the output coupling circuit has a current mirror that reflects a current fed out of the differential amplifier into the internal feedback, and reflects the current into a current branch leading to the feedback input and into a measuring branch of the adapter circuit.

6. The driver circuit according to claim 1, wherein the adapter circuit has a detector that detects a signal amplitude of the coupled-out feedback signal and transmits it to a control unit.

7. The driver circuit according to claim 5, wherein the detector periodically samples an amplitude of the signal.

8. The driver circuit according to claim 7, wherein the detector is a clocked comparator.

9. The driver circuit according to claim 5, wherein a control unit stores an amplitude of the signal and, by controlling a compensating current source, creates a compensating current at the reference input or the feedback input that at least partially compensates an offset current.

10. A method for compensating offset currents in a driver circuit, which in an operating mode drives a component that only supplies output power when a driving input signal exceeds a first threshold value, and which includes a differential amplifier whose output signal controls the driving input signal, a reference signal generator that supplies a reference signal to a reference input of the differential amplifier, and an external feedback that applies a signal, which is dependent on the output signal, to a feedback input of the differential amplifier, the method comprising the steps of:

activating an internal feedback that is activated as an alternative to the external feedback and that provides a signal to both the feedback input and an adapter circuit, even when the driving input signal does not exceed the first threshold;

storing a compensation signal that is generated from the signal and that compensates an offset signal acting alone at the reference input when the reference signal generator is switched off; and feeding the stored compensation signal to the reference input or the feedback input, in addition to the feeding of the reference signal provided by the reference signal generator when the external feedback is activated.

11. The method according to claim 10, wherein the generation of the compensation signal is performed in a stepwise manner, wherein the signal supplied to the adapter circuit is compared to a third threshold, and wherein the compensation signal is changed in a stepwise fashion from a starting value until the signal supplied to the adapter circuit crosses the third threshold.

12. The driver circuit according to claim 1, wherein the component is a laser diode.

* * * * *